(12) United States Patent
Moriya (10) Patent No.: US 8,152,907 B2
(45) Date of Patent: Apr. 10, 2012

(54) GAS PURIFICATION APPARATUS AND METHOD

(75) Inventor: Tsuyoshi Moriya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 679 days.

(21) Appl. No.: 12/174,040

(22) Filed: Jul. 16, 2008

(65) Prior Publication Data

US 2009/0025552 A1 Jan. 29, 2009

Related U.S. Application Data

(60) Provisional application No. 60/982,758, filed on Oct. 26, 2007.

(30) Foreign Application Priority Data

Jul. 26, 2007 (JP) ................................ 2007-194811

(51) Int. Cl.
B01D 35/18 (2006.01)

(52) U.S. Cl. ....... 95/283; 55/282.3; 55/467.1; 55/490.1; 55/DIG. 10; 95/73; 96/16; 96/74; 96/225

(58) Field of Classification Search ................. 55/282.2, 55/282.3, 467.1, 490.1, DIG. 10; 95/73, 95/283; 96/16, 74, 225
See application file for complete search history.

(56) References Cited

U.S. PATENT DOCUMENTS

| | | | | |
|---|---|---|---|---|
| 1,825,808 A | * | 10/1931 | Melcher | 62/317 |
| 1,853,333 A | * | 4/1932 | Bates | 55/467.1 |
| 1,887,737 A | * | 11/1932 | Shurtleff | 55/467.1 |
| 3,429,057 A | * | 2/1969 | Thygeson, Sr. | 34/656 |
| 3,672,342 A | * | 6/1972 | Ojala | 123/538 |
| 4,202,676 A | * | 5/1980 | Pelosi et al. | 96/416 |
| 4,707,167 A | * | 11/1987 | Saito et al. | 96/225 |
| 4,749,385 A | * | 6/1988 | Brunner et al. | 95/273 |
| 6,129,781 A | * | 10/2000 | Okamoto et al. | 96/25 |
| 6,251,170 B1 | * | 6/2001 | Hironaka et al. | 96/28 |
| 6,299,668 B1 | * | 10/2001 | Penth et al. | 95/45 |
| 6,494,934 B2 | * | 12/2002 | Fukushima | 95/63 |
| 6,833,122 B2 | * | 12/2004 | Reisfeld | 422/186.3 |
| 2003/0024393 A1 | * | 2/2003 | Lim | 95/274 |
| 2005/0005585 A1 | * | 1/2005 | Kim | 55/467.1 |

FOREIGN PATENT DOCUMENTS

| | | |
|---|---|---|
| JP | A-64-058356 | 3/1989 |
| JP | Y2-1-43455 | 12/1989 |
| JP | A-04-098034 | 3/1992 |
| JP | A-09-276738 | 10/1997 |
| JP | 2002-35524 | 2/2002 |

OTHER PUBLICATIONS

Office Action issued in Japanese Patent Application No. 2007-194811 mailed on Aug. 2, 2011 (with partial English translation).

* cited by examiner

*Primary Examiner* — Richard L Chiesa (74) *Attorney, Agent, or Firm* — Oblon, Spivak, McClelland, Maier & Neustadt, L.L.P.

(57) ABSTRACT

A gas purification apparatus capable of removing fine particles of substantially any size without lowering the efficiency of gas supply. A loader module of a substrate processing apparatus includes a fan filter unit for producing a downward flow of atmospheric air in the internal space of a transfer chamber. The fan filter unit includes a fan for generating an atmospheric air flow, a filter of mesh structure for trapping and removing particles mixed in the atmospheric air flow, an irradiation heater disposed between the fan and the filter, and a high temperature part disposed in the atmospheric air flow and higher in temperature than the filter.

7 Claims, 9 Drawing Sheets

GAS PURIFICATION APPARATUS AND METHOD

BACKGROUND OF THE INVENTION

1. Field of the Invention

The present invention relates to a gas purification apparatus and method, and more particular, to a gas purification apparatus for removing fine particles entrained in a gas flow.

2. Description of the Related Art

A semiconductor device fabricated on a wafer substrate is formed thereon with wirings of several tens nm width. If fine particles of several tens nm size are adhered to the wirings, short circuit or other problems can be caused.

Thus, there is a strong demand to remove particles from a semiconductor device fabrication apparatus, especially from a substrate processing apparatus in which plasma etching is performed on wafers. As a removal apparatus for effectively removing gaseous impurities or fine particles, there has been developed, for example, a removal apparatus including a wet removal unit and two filters made of filter materials having different densities (see, for example, Japanese Laid-open Patent Publication No. 2002-35524).

A substrate processing apparatus includes a fan filter unit as an apparatus for supplying atmospheric air while removing particles. The fan filter unit is disposed in a transfer chamber space of a loader module. The chamber space is a mini environment isolated from a surrounding environment and small in volume in comparison with a clean room.

The fan filter unit includes a fan for generating a gas flow directed from a surrounding environment (external environment) toward the internal space of the transfer chamber. The fan filter unit also includes a filter made of an aggregate of mesh-like fibers. The filter of the fan filter unit traps and removes particles mixed in the gas flow and larger in size than the mesh size.

However, the filter of the conventional fan filter unit such as an ULPA (ultra low penetration air filter) or a HEPA (high efficiency particulate air filter) has a mesh size of several hundreds nm, and cannot remove particles of several tens nm size, which cause short circuit or other problems in a semiconductor device.

Though it is possible to remove particles of several tens nm size by means of a filter in which the mesh size is made small, such a filter is low in conductance and causes a reduction in the efficiency of gas supply into the internal space of the transfer chamber.

SUMMARY OF THE INVENTION

The present invention provides a gas purification apparatus and method capable of removing fine particles of substantially any size without lowering the efficiency of gas supply.

According to a first aspect of this invention, there is provided a gas purification apparatus comprising a fan adapted to generate a gas flow, at least one filter adapted to trap and remove fine particles mixed in the gas flow, and at least one high temperature part disposed in the gas flow and higher in temperature than the filter.

With the gas purification apparatus of this invention, a temperature gradient is produced between the filter and the high temperature part higher in temperature than the filter, and fine particles are moved by a heat migrating force due to the temperature gradient. Since the magnitude of the heat migrating force varies in dependence on the size of fine particles on which the heat migrating force acts, the heat migrating force becomes larger with the increase in fine particle size.

However, a gravity force acting on a large fine particle is large in magnitude, and hence a transfer force to move the large fine particle toward the filter is not very large. On the other hand, a transfer force to move a small fine particle is not very small since a gravity force acting on the small fine particle is small, though a heat migrating force acting on the small fine particle is small. In other words, transfer forces resulting from the heat migrating force and acting on fine particles are almost the same between fine particles of any size. Fine particles moved to the filter are adhered to the filter through van del Waals force. That is, the filter is able to trap all the fine particles including ones of several tens nm size without the need for the filter of being small in mesh size, whereby fine particles of substantially any size can be removed without causing a reduction in the efficiency of gas supply.

The gas purification apparatus can include a temperature difference maintaining device adapted to maintain a temperature difference between the high temperature part and the filter.

In that case, the temperature difference between the high temperature part and the filter is maintained, and the heat migrating force to move fine particles toward the filter can be applied, thus making it possible to reliably remove fine particles.

The temperature difference maintaining device can be adapted to maintain the temperature difference between the high temperature part and the filter at a value equal to or larger than 3 degrees Celsius.

In that case, the temperature difference not less than 3 degrees Celsius is maintained between the high temperature part and the filter, whereby the heat migrating force can positively be applied to fine particles.

The at least one high temperature part can include at least one high temperature part disposed upstream of the filter in the gas flow and at least one high temperature part disposed downstream of the filter in the gas flow.

In that case, a temperature gradient is produced between the filter and the high temperature part at locations upstream and downstream of the filter in the gas flow, whereby a heat migrating force can be applied to fine particles located upstream and downstream of the filter, and hence fine particles can positively be trapped by the filter.

The at least one filter can include a first filter and a second filter smaller in mesh size than the first filter, and at least one of the first and second filters can be made lower in temperature than the high temperature part.

In that case, a temperature gradient is produced between the first filter and the high temperature part and/or between the second filter smaller in mesh size than the first filter and the high temperature part. Thus, the first filter and/or the second filter is able to trap fine particles being moved by a heat migrating force. In addition, fine particles unable to be trapped by the first filter can be trapped by the second filter, thereby making it possible to trap fine particles more reliably. Relatively large-sized fine particles are trapped by the first filter, and relatively small-sized fine particles are trapped by the second filter. Therefore, the first and second filters become less clogged, and the service life of the gas purification apparatus can be made long.

The second filter can be made of a porous material.

In that case, the second filter made of a porous material is able to positively trap relatively small fine particles.

The at least one filter can include a mesh-like filter and a chemical filter, and at least one of the mesh-like filter and the chemical filter can be lower in temperature than the high temperature part.

In that case, a temperature gradient is produced between the mesh-like filter and the high temperature part and/or between the chemical filter and the high temperature part. The mesh-like filter and/or the chemical filter is able to trap fine particles being moved by a heat migrating force. In addition, the chemical filter is able to trap gas molecules not trapped by the mesh-like filter, which are the cause of generation of fine particles or which are not the cause of fine particle generation but are the cause of various problems. Thus, it is possible to trap fine particles more reliably. Relatively large-sized fine particles are trapped by the mesh-like filter, and relatively small-sized gas molecules are trapped by the chemical filter. As a result, the mesh-like filter and the chemical filter become less clogged, and the service life of the gas purification apparatus can be made long.

The at least one filter can be made of a high thermal conductivity material.

In that case, a temperature distribution can be made uniform over the filter since the filter is made of high thermal conductivity material. As a result, a temperature gradient directed to all the filter portions can reliably be produced.

The gas purification apparatus can include a filter potential generation unit adapted to generate, on the filter, electric potential of polarity opposite from that of the fine particles.

In that case, the filter has an electric potential opposite in polarity from fine particles, whereby the fine particles can be moved toward the filter also by an electrostatic force. Therefore, the fine particles can positively be removed without causing a reduction in the efficiency of gas supply.

The gas purification apparatus can include an electric potential measurement unit adapted to measure polarity of electric potential on the fine particles.

In that case, by referring to the measured polarity of electric potential on the fine particles, it is possible to ensure that the filter has electric potential of polarity opposite from that of the fine particles.

The electric potential measurement unit can include first and second electrodes facing each other and a fine particle introduction unit adapted to introduce the fine particles between the first and second electrodes, the first electrode can be supplied with a positive voltage from a first power supply, a first current measurement device can be connected between the first electrode and the first power supply, the second electrode can be supplied with a negative voltage from a second power supply, and a second current measurement device can be connected between the second electrode and the second power supply.

In that case, fine particles, if being charged, are introduced between the first and second electrodes, and trapped by the first or second electrode according to the polarity of the fine particles. Electric charges on the trapped fine particles move from the particles to the first or second power supply to generate an electric current. By measuring the electric current by means of the first or second current measurement device, it is possible to reliably measure the polarity of the fine particles.

The gas purification apparatus can include a fine particle charging unit adapted to charge the fine particles to thereby forcibly generate thereon electric potential of polarity opposite from that of the filter.

In that case, electric potential opposite in polarity from the filter is forcibly generated on fine particles, whereby the electric potential of the fine particles can reliably be set to a polarity opposite from that of the filter. As a result, the fine particles can reliably be applied with an electrostatic force acting toward the filter.

The fine particle charging unit can be comprised of one selected from a group consisting of an ionizer, an excimer laser oscillator, an ultraviolet lamp, and a soft X-ray radiation unit.

In that case, fine particles can reliably be charged by the fine particle charging unit comprised of the ionizer, excimer laser oscillator, ultraviolet lamp, or soft X-ray radiation unit.

The gas purification apparatus can include a filter potential generation unit adapted to generate positive electric potential and negative electric potential on the filter.

In that case, since the positive potential and negative potential are produced on the filter, fine particles can be applied with an electrostatic force acting toward the filter, irrespective of the polarity of the fine particles.

The filter potential generation unit can be adapted to alternately generate the positive electric potential and the negative electric potential on the filter.

In that case, since positive electric potential and negative electric potential are alternately produced on the filter, fine particles can reliably be trapped by the filter before passing therethrough, without regard to the polarity of the fine particles.

The gas purification apparatus can include a heating unit adapted to heat the filter.

In that case, by heating the filter, fine particles trapped by the filter can be discharged by thermal stress, and therefore the filter can easily be cleaned.

According to a second aspect of this invention, there is provided a gas purification method for a gas purification apparatus including a fan for generating a gas flow and at least one filter for trapping and removing fine particles mixed in the gas flow, the gas purification method comprising a high temperature part generation step of generating at least one high temperature part in the gas flow, the at least one high temperature part being higher in temperature than the filter.

According to the gas purification method of this invention, the same effects as those attained by the gas purification apparatus of this invention can be attained.

The filter can be cooled in the high temperature part generation step.

In that case, by cooling the filter, a temperature gradient can positively be produced between the filter and the high temperature part, making it possible to positively apply a heat migrating force on fine particles.

The method can include a filter potential generation step of generating, on the filter, electric potential of polarity opposite from that of the fine particles.

In that case, the filter has an electric potential opposite in polarity from fine particles, whereby the fine particles can be moved toward the filter also by an electrostatic force. Therefore, the fine particles can positively be removed without causing a reduction in the efficiency of gas supply.

The gas purification method can include a particle potential measurement step of measuring polarity of electric potential of the fine particles.

In that case, by referring to the measured polarity of electric potential of the fine particles, it is ensured that the filter has electric potential of polarity opposite from that of the fine particles.

The gas purification method can include a particle potential generation step of charging the fine particles to thereby generate thereon electric potential of polarity opposite from that of the filter.

In that case, electric potential opposite in polarity from the filter is forcibly generated on fine particles, whereby the electric potential of the fine particles can reliably be set to a polarity opposite from that of the filter. As a result, the fine particles can reliably be applied with an electrostatic force acting in the direction toward the filter.

Further features of the present invention will become apparent from the following description of exemplary embodiments with reference to the attached drawings.

DETAILED DESCRIPTION OF THE PREFERRED EMBODIMENTS

The present invention will now be described in detail below with reference to the drawings showing preferred embodiments thereof.

First, a gas purification apparatus and method according to a first embodiment of this invention will be described.

Figure 1:
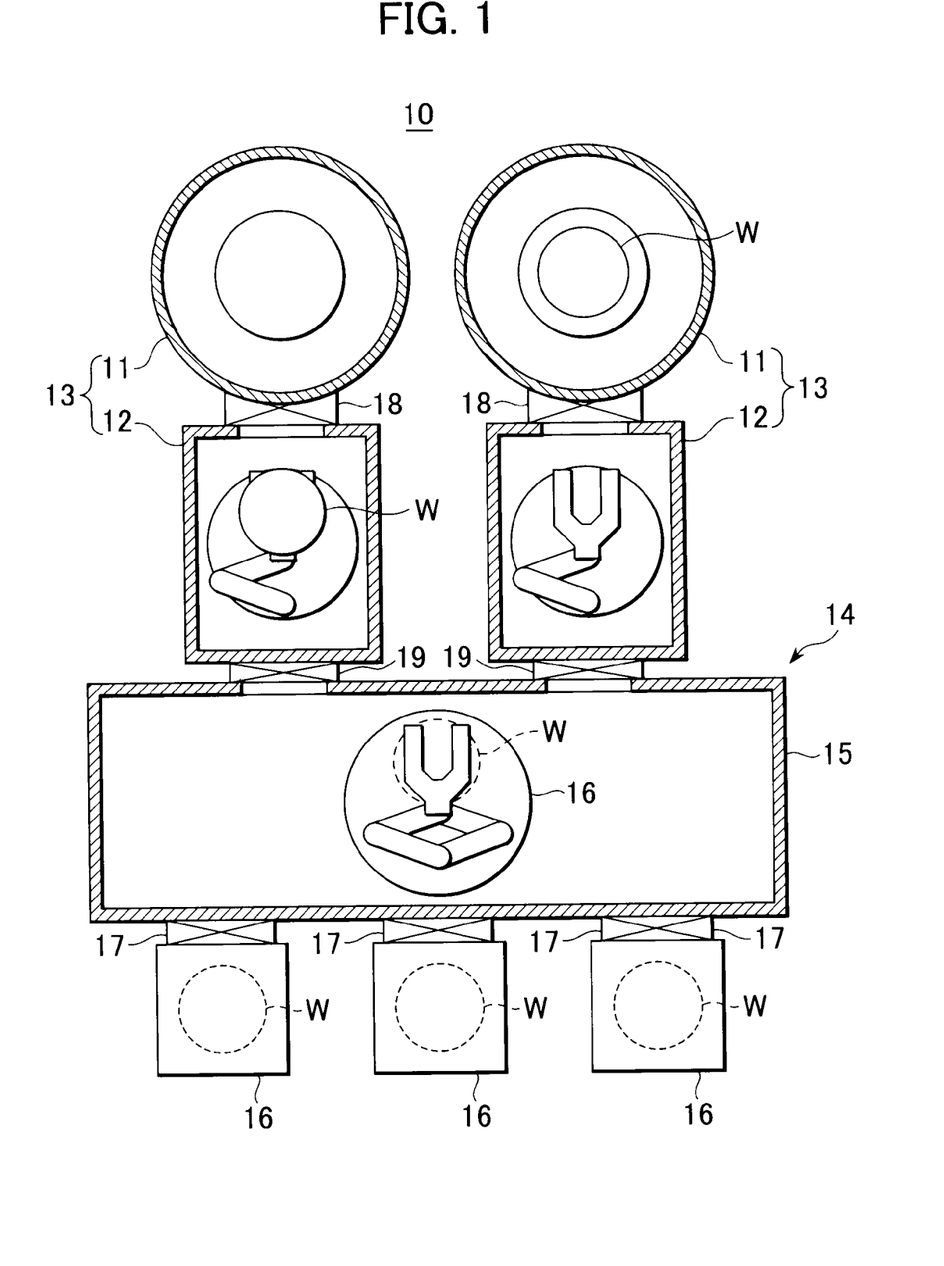
FIG. 1 is a horizontal section view schematically showing the construction of a substrate processing apparatus having a loader module to which a fan filter unit as a gas purification apparatus according to a first embodiment of this invention is applied.

FIG. 1 schematically shows in horizontal cross section a substrate processing apparatus having a loader module to which a fan filter unit as a gas purification apparatus according to this embodiment is applied.

As shown in FIG. 1, the substrate processing apparatus 10 includes two process ships 13 and a loader module 14. The process ships 13 each include a process module 11 in which etching is carried out on a wafer W as a substrate, and a load lock module 12 for transferring a wafer W into and out of the process module 11. Each process ship 13 is connected to the loader module 14. The loader module 14 is disposed adjacent to the process modules 11 via the load lock modules 12.

The loader module 14 includes a rectangular parallelepiped transfer chamber 15 and a transfer arm 16 disposed inside the transfer chamber 15 for transferring a wafer W in the chamber 15. Though the internal space of the transfer chamber 15 is isolated from the surrounding environment thereof, atmospheric air is supplied into the internal space of the transfer chamber 15 via a fan filter unit 20 described later. Thus, the internal pressure of the transfer chamber 15 is held at atmospheric pressure.

Three FOUPs (front opening unified pods) 16, which are containers each for housing twenty-five wafers, are connected to the transfer chamber 15 of the loader module 14 via three loading ports 17 as entry ports for a wafer W. The three FOUPs 16 are disposed to face the two process ships 13, with the transfer chamber 15 disposed therebetween.

In the loader module 14, the transfer arm 16 is disposed in the transfer chamber 15 so as to be movable in the vertical direction (depth direction in FIG. 1) and the left-to-right direction (longitudinally of the transfer chamber 15). The transfer arm 16 transfers a wafer W to be processed from each FOUP 16 via the loading port 17 and transfers the transferred wafer W into each load lock module 12. Further, the transfer arm 16 transfers the processed wafer W out from each load lock module 12 and transfers the transferred wafer W into each FOUP 16.

As described above, the internal pressure of the transfer chamber 15 of the loader module 14 is held at atmospheric pressure. On the other hand, the internal pressure of the process module 11 is held at vacuum pressure. To this end, the load lock module 12 is formed as a preliminary vacuum transfer chamber which has an adjustable internal pressure and in which a vacuum gate valve 18 is disposed at a coupling part with the process module 11 and an atmospheric gate valve 19 is disposed at a coupling part with the loader module 14.

Figure 2:
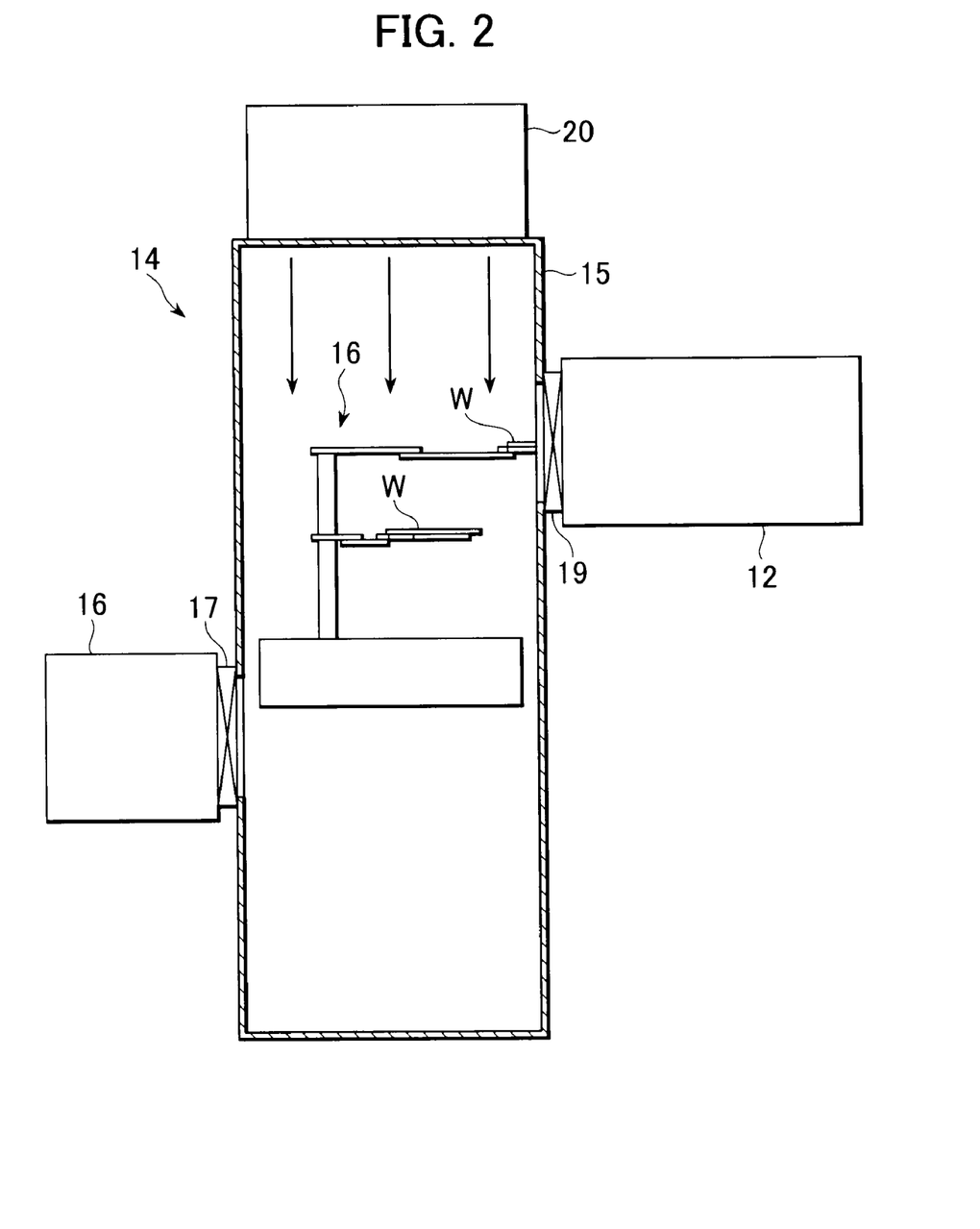
FIG. 2 is a section view schematically showing the construction of the loader module shown in FIG. 1.

FIG. 2 schematically shows in cross section the construction of the loader module 14.

As shown in FIG. 2, the loader module 14 includes a fan filter unit 20 (gas purification apparatus) in addition to the transfer chamber 15 and the transfer arm 16, described above.

The fan filter unit 20 is adapted to supply atmospheric air into the internal space of the transfer chamber 15. When supplying atmospheric air, the fan filter unit 20 removes fine particles (hereinafter referred to as particles) from the atmospheric air by a filter 22 incorporated in the unit 20 as described later. Since the fan filter unit 20 is disposed upward of the transfer chamber 15, the atmospheric air supplied from the fan filter unit 20 into the internal space of the transfer chamber 15 flows downwardly. As a result, particles in the internal space of the transfer chamber 15 are suppressed to be stirred up.

Figure 3:
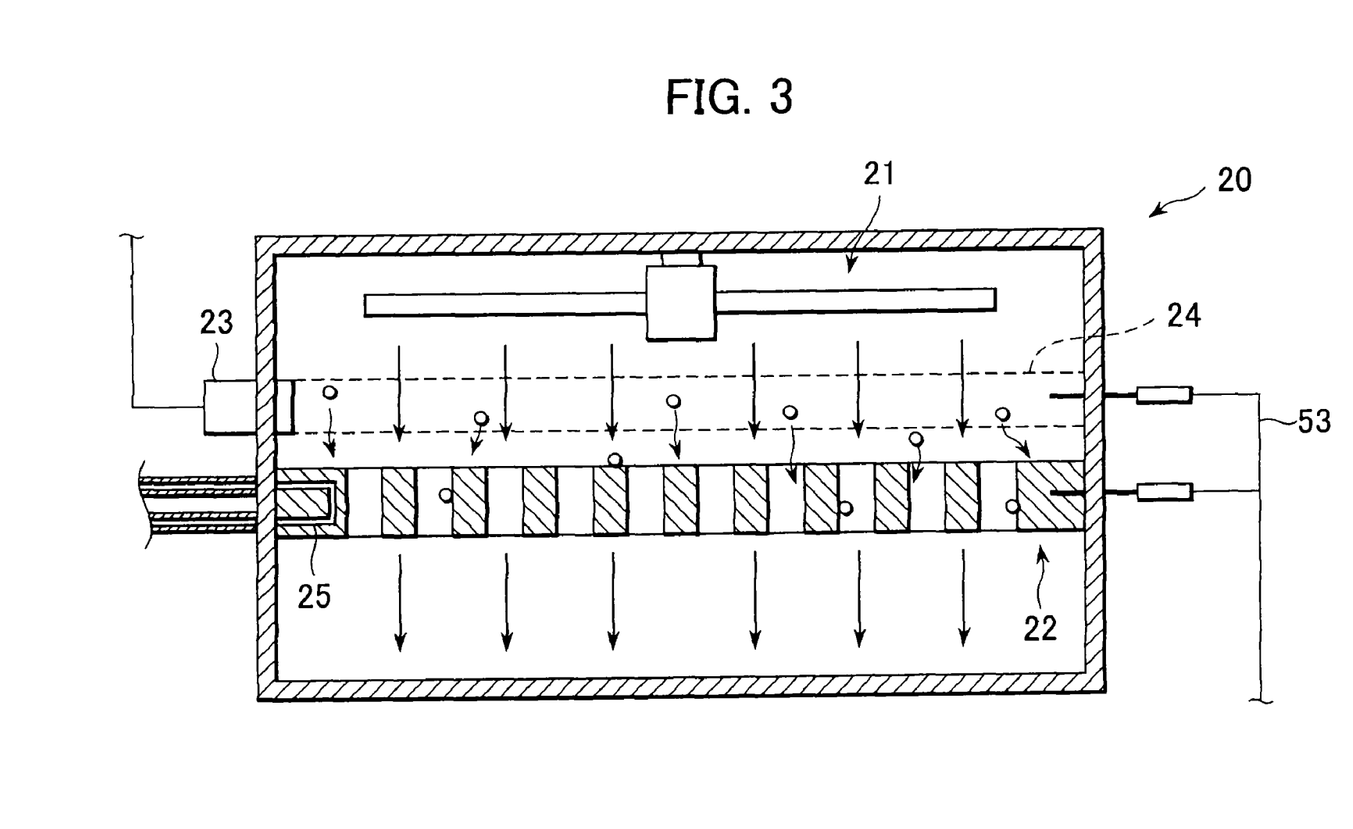
FIG. 3 is a section view schematically showing the construction of the fan filter unit shown in FIG. 2.

FIG. 3 schematically shows in cross section the construction of the fan filter unit in FIG. 2.

As shown in FIG. 3, the fan filter unit 20 includes a fan 21 for generating an atmospheric air flow (shown by arrows) directed downward to the internal space of the transfer chamber 15, a filter 22 comprised of a mesh structure for trapping particles mixed in the atmospheric air flow to thereby remove the particles, and an irradiation heater 23 disposed between the fan 21 and the filter 22.

The irradiation heater 23 irradiates infrared rays onto the atmospheric air flow between the fan 21 and the filter 22, whereby a high temperature part 24 higher in temperature than the atmospheric air is produced in the atmospheric air flow (high temperature part generation step). In other words, the fan filter unit 20 includes the high temperature part 24 in the atmospheric air flow between the fan 21 and the filter 22.

The filter 22 has a cooling channel 25 (temperature difference maintaining device) formed therein for cooling the filter 22. By means of a coolant circulating in the cooling channel 25, the filter 22 is cooled to a temperature lower than atmospheric air temperature. In other words, the cooling channel 25 holds the high temperature part 24 at a temperature higher than that of the filter 22 so as to maintain a temperature difference between the high temperature part 24 and the filter 22. More specifically, the cooling channel 25 cools the filter 22 such as to maintain the temperature difference between the high temperature part 24 and the filter 22 at a value equal to or larger than 3 degrees Celsius.

Generally, in a case where a temperature difference between a high temperature part and a lower temperature part is equal to or larger than 3 degrees Celsius, a heat migrating force due to the resultant temperature gradient acts on fine particles. It is known that the heat migrating force is a driving force exerting in a direction from the high temperature part to the low temperature part, and fine particles to which the heat migrating force is applied move from the high temperature part to the low temperature part. In the fan filter unit 20 of this embodiment, a temperature difference between the high temperature part 24 and the filter 22 is maintained at a value equal to or greater than 3 degree Celsius. Accordingly, a heat migrating force due to the temperature gradient between the high temperature part 24 and the filter 22 acts on particles (denoted by circle marks) mixed in the atmospheric air flow, and particles on which the heat migrating force acts move toward the filter 22.

In a strict sense, the magnitude of heat migrating force varies depending on the size of a particle on which the heat migrating force acts, and a heat migrating force acting on a large particle is large in magnitude, but a large gravity force acts on such a large particle. As a result, a transfer force acting on the large particle in a direction toward the filter 22 is not very large. On the other hand, a small heat migrating force acts on a small particle, but such a small particle is only applied with a small gravity force. As a consequence, a transfer force acting on the small particle to move the particle toward the filter 22 is not very small. Thus, transfer forces of nearly the same magnitude caused by heat migrating force and acting in the direction to move particles toward the filter 22 are applied to large and small particles. In the fan filter unit 20, therefore, substantially the same transfer forces acting toward the filter 22 are applied to all the particles mixed in the atmospheric air flow.

The fan filter unit 20 further includes a temperature sensor 53 for measuring temperatures of the high temperature part 24 and the filter 22. The temperature sensor 53 transmits an electrical signal representing the measured temperatures of the high temperature part 24 and the filter 22 to a controller, not shown. Based on the measured temperatures of the high temperature part 24 and the filter 22, the controller controls the temperature and flow rate of a coolant being supplied to the cooling channel 25 such as to maintain a temperature difference between the high temperature part 24 and the filter 22 to a value equal to or greater than 3 degrees Celsius.

The filter 22 of the fan filter unit 20 is made of a high thermal conductivity material such as shown in Table 1 given below. A material having a thermal conductivity of 100 W/m·K or more such as aluminum or iridium is suitable for use as the high thermal conductivity material.

If being made of the high thermal conductivity material, the filter 22 can uniformly be cooled, whereby a uniform temperature distribution can be attained over the filter 22.

TABLE 1

| | Thermal conductivity (W/m · K) | | | | |
|---|---|---|---|---|---|
| | −100 deg C. | 0 deg C. | 100 deg C. | 300 deg C. | 700 deg C. |
| Zinc | 117 | 117 | 112 | 104 | 66 |
| Aluminum | 241 | 236 | 240 | 233 | 92 |
| Antimony | 33 | 25.5 | 22 | 19 | 27 |
| Iridium | 156 | 147 | 145 | 139 | — |
| Indium | 92 | 84 | 76 | 42 | — |
| Cadmium | 100 | 97 | 95 | 89 | 45 |
| Potassium | 105 | 104 | 53 | 45 | 32 |

TABLE 1-continued

| | Thermal conductivity (W/m · K) | | | | |
|---|---|---|---|---|---|
| | −100 deg C. | 0 deg C. | 100 deg C. | 300 deg C. | 700 deg C. |
| Gold | 324 | 319 | 313 | 299 | 272 |
| Silver | 432 | 428 | 422 | 407 | 377 |
| Constantan | 19 | 22 | 24 | 27 | — |
| Mercury | 29.5 | 7.8 | 9.4 | 11.7 | — |
| Tin | 76 | 68 | 63 | 32 | 40 |
| Thallium | 51 | 47 | 44 | — | — |
| Tungsten | 188 | 177 | 163 | 139 | 119 |
| Tantalum | 58 | 57 | 58 | 58.5 | 60 |
| Iron | 99 | 83.5 | 72 | 56 | 34 |
| Copper | 420 | 403 | 395 | 381 | 354 |
| Sodium | 141 | 142 | 88 | 78 | 60 |
| Lead | 37 | 36 | 34 | 32 | 21 |
| Nickel | 113 | 94 | 83 | 67 | 71 |
| Platinum | 73 | 72 | 72 | 73 | 78 |
| Palladium | 72 | 72 | 73 | 79 | 93 |
| Bismuth | 11 | 8.2 | 7.2 | 13 | 17 |
| Beryllium | 367 | 218 | 168 | 129 | 93 |
| Magnesium | 160 | 157 | 154 | 150 | — |
| Manganese | 7 | 8 | — | — | — |
| Molybdenum | 145 | 139 | 135 | 127 | 113 |

With the fan filter unit 20 of this embodiment, particles are moved toward the filter 22 by means of a heat migrating force caused by a temperature gradient between the filter 22 and the high temperature part 24. At that time, substantially the same transfer forces act on all the particles to move the particles toward the filter 22. The particles moved to the filter 22 are adhered to the filter 22 through van del Waals force. Accordingly, the filter 22 is able to trap all the particles mixed in the atmospheric air flow and including particles of several tens nm size, without the need for the filter 22 of being small in mesh size. It is therefore possible to remove particles of substantially any size without lowering the efficiency of atmospheric air supply.

In the above described fan filter unit 20, a temperature difference between the high temperature part 24 and the filter 22 is maintained to be equal to 3 degrees Celsius or more, and therefore a heat migrating force can positively be applied to particles, whereby it is ensured that the particles are moved toward the filter 22 by means of the heat migrating force. As a result, the filter 22 is able to positively trap and remove the particles.

In the fan filter unit 20, since the filter 22 is made of the high thermal conductivity material, a temperature distribution can be made uniform over the filter 22. Thus, it is ensured that a temperature gradient directed to all the parts of the filter 22 is produced.

The above described fan filter unit 20 only includes one high temperature part 24 in the atmospheric air flow, however, a plurality of high temperature parts may be provided.

Figure 4:
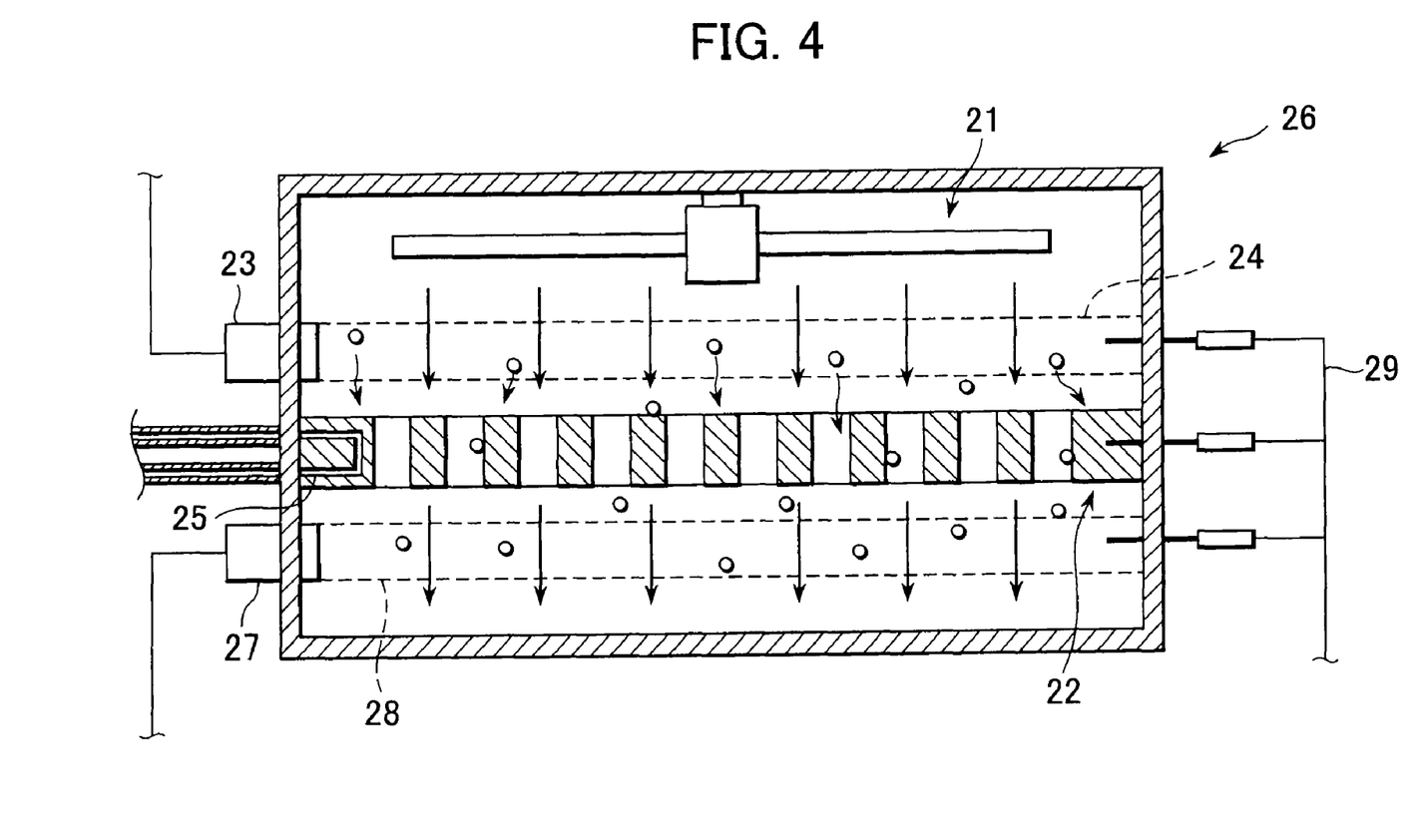
FIG. 4 is a section view schematically showing the construction of a fan filter unit having a plurality of high temperature parts disposed in an atmospheric air flow.

FIG. 4 schematically shows in cross section the construction of a fan filter unit 26 having a plurality of high temperature parts in the atmospheric air flow. The fan filter unit 26 of FIG. 4 is basically the same in construction and function as the above described fan filter unit 20. In the following, only different constructions and functions will be explained, with explanations of common constructions and functions omitted.

As shown in FIG. 4, the fan filter unit 26 includes an irradiation heater 23 disposed between the fan 21 and the filter 22, i.e., disposed upstream of the filter 22 in the atmospheric air flow, and an irradiation heater 27 disposed below the filter 22 in FIG. 4, i.e., disposed downstream of the filter 22 in the atmospheric air flow.

The irradiation heater 27 is adapted to irradiate infrared rays to the atmospheric air flow. As a result, a high temperature part 28 higher in temperature than the atmospheric air temperature is produced at a location downstream of the filter 22 in the atmospheric air flow. In the fan filter unit 20 where the high temperature parts 24, 28 are provided upstream and downstream of the filter 22 in the atmospheric air flow, a temperature gradient is produced between the filter 22 and the high temperature part 24 and between the filter 22 and the high temperature part 28. Therefore, a heat migrating force can be applied to particles located upstream and downstream of the filter 22 in the atmospheric air flow, whereby the filter 22 is enabled to reliably trap the particles.

In the fan filter unit, the high temperature part may be provided only at a location downstream of the filter 22 in the atmospheric air flow. To produce a heat migrating force acting on particles mixed in the atmospheric air flow in a direction toward filter 22, it is sufficient to produce a temperature gradient between the filter 22 and at least one place in the atmospheric air flow. This indicates that it is not inevitably necessary for the fan filter unit to include both the irradiation heater 23 and the cooling channel 25. Specifically, the fan filter unit may not include the irradiation heater 23 but may include only the cooling channel 25, so as to cool the filter 22 to a temperature lower than that of the atmospheric air flow. Alternatively, the fan filter unit may not include the cooling channel 25 but may include only the irradiation heater 23, so as to produce, in the atmospheric air flow, the high temperature part 24 higher in temperature than the filter 22.

The fan filter unit 26 may include a temperature sensor 29 for measuring temperatures of the filter 22 and the high temperature parts 24, 28. In that case, the temperature and flow rate of a coolant being supplied to the cooling channel 25 may be controlled based on the measured temperatures of the filter 22 and the high temperature parts 24, 28 such as to maintain a temperature difference between the high temperature part 24 and the filter 22 and between the high temperature part 28 and the filter 22 at a value equal to or greater than 3 degrees Celsius.

The above described fan filter unit 20 only includes one filter 22, but may include a plurality of filters. The following is a description of two concrete examples.

Figure 5:
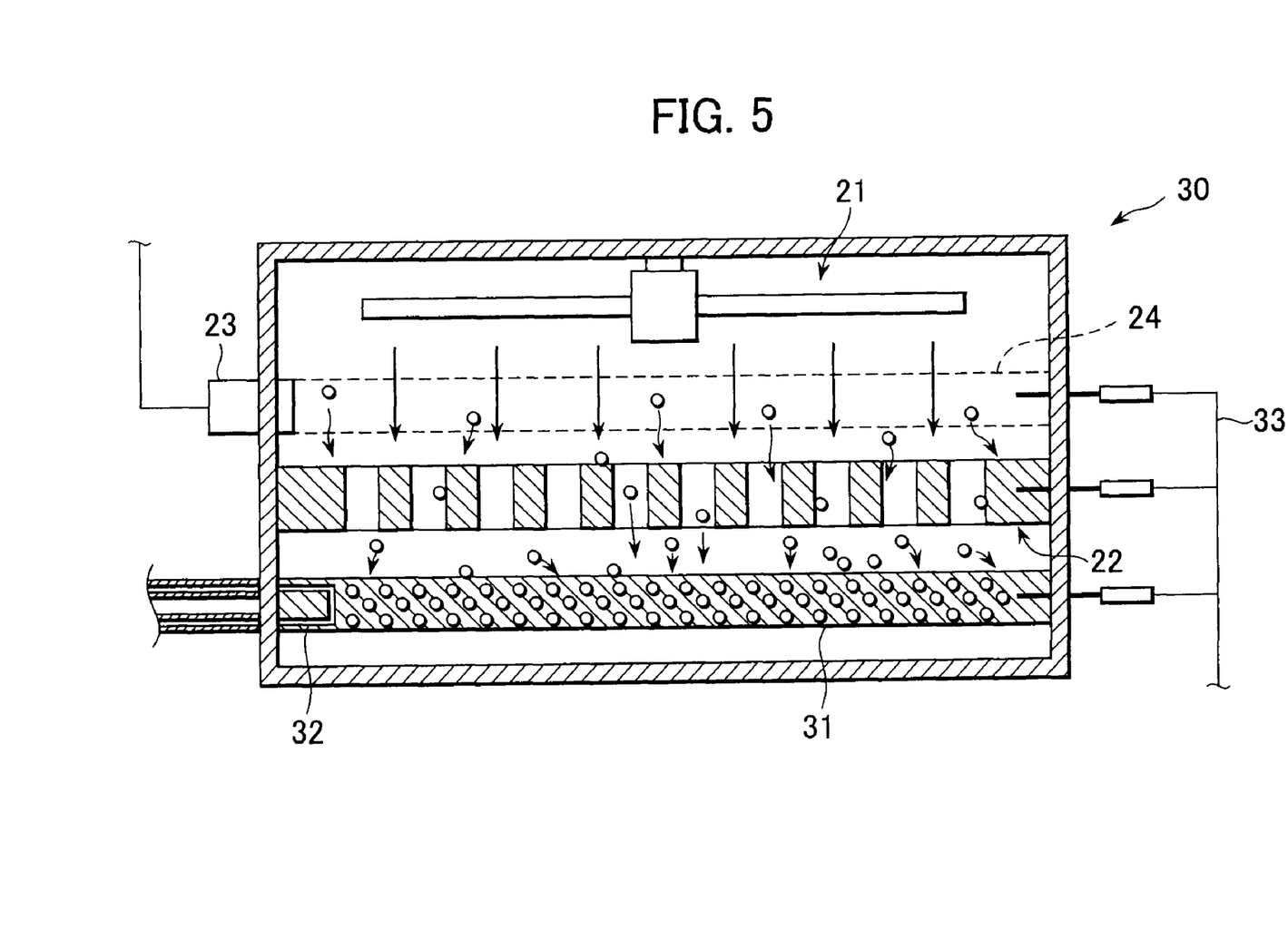
FIG. 5 is a section view schematically showing the construction of a fan filter unit including a filter of mesh structure and a filter of porous material.

FIG. 5 schematically shows in cross section the construction of a fan filter unit 30 including a filter of mesh structure and a filter of porous material. The fan filter unit 30 of FIG. 5 is basically the same in construction and function as the above described fan filter unit 20. In the following, only different constructions and functions will be explained, with explanations of common constructions and functions omitted.

As shown in FIG. 5, the fan filter unit 30 not only includes the filter 22 (first filter) of mesh structure but also includes a filter 31 of porous material (second filter) disposed blow the filter 22 in FIG. 5.

The porous material constituting the filter 31 includes a large number of minute pores (which are about several tens nm in diameter) each functioning as a mesh. Thus, the filter 31 is able to trap and remove particles of several tens nm size as well as particles of several hundreds nm size.

The filter 31 further includes a cooling channel 32 formed therein for cooling the filter 31, whereby the temperature of the filter 31 can be made at a temperature lower than that of the high temperature part 24 and a temperature gradient can be produced between the filter 31 and the high temperature part 24. In the fan filter unit 30, though the filter 22 does not include a cooling channel, the filter 22 is kept at a temperature near the atmospheric air temperature, which is lower in temperature than the high temperature part 24. As a result, a temperature gradient is also produced between the filter 22 and the high temperature part 24.

With the fan filter unit 30, the filter 22 and/or the filter 31 is able to trap particles being moved by a heat migrating force due to the temperature gradient between the filter 22 and the high temperature part 24 and/or between the filter 31 and the high temperature part 24. Particles not trapped by the filter 22 can be trapped by the filter 31. Therefore, particles can be removed more reliably. Since relative large particles are trapped by the filter 22 and relatively small particles are trapped by the filter 31, the filters 22, 31 are made less clogged, whereby the service life of the fan filter unit 30 can be made long.

The fan filter unit 30 may include a temperature sensor 33 for measuring temperatures of the filters 22, 31 and the high temperature part 24. In that case, effects similar to those attained by the above described arrangement including such a temperature sensor can be attained.

Figure 6:
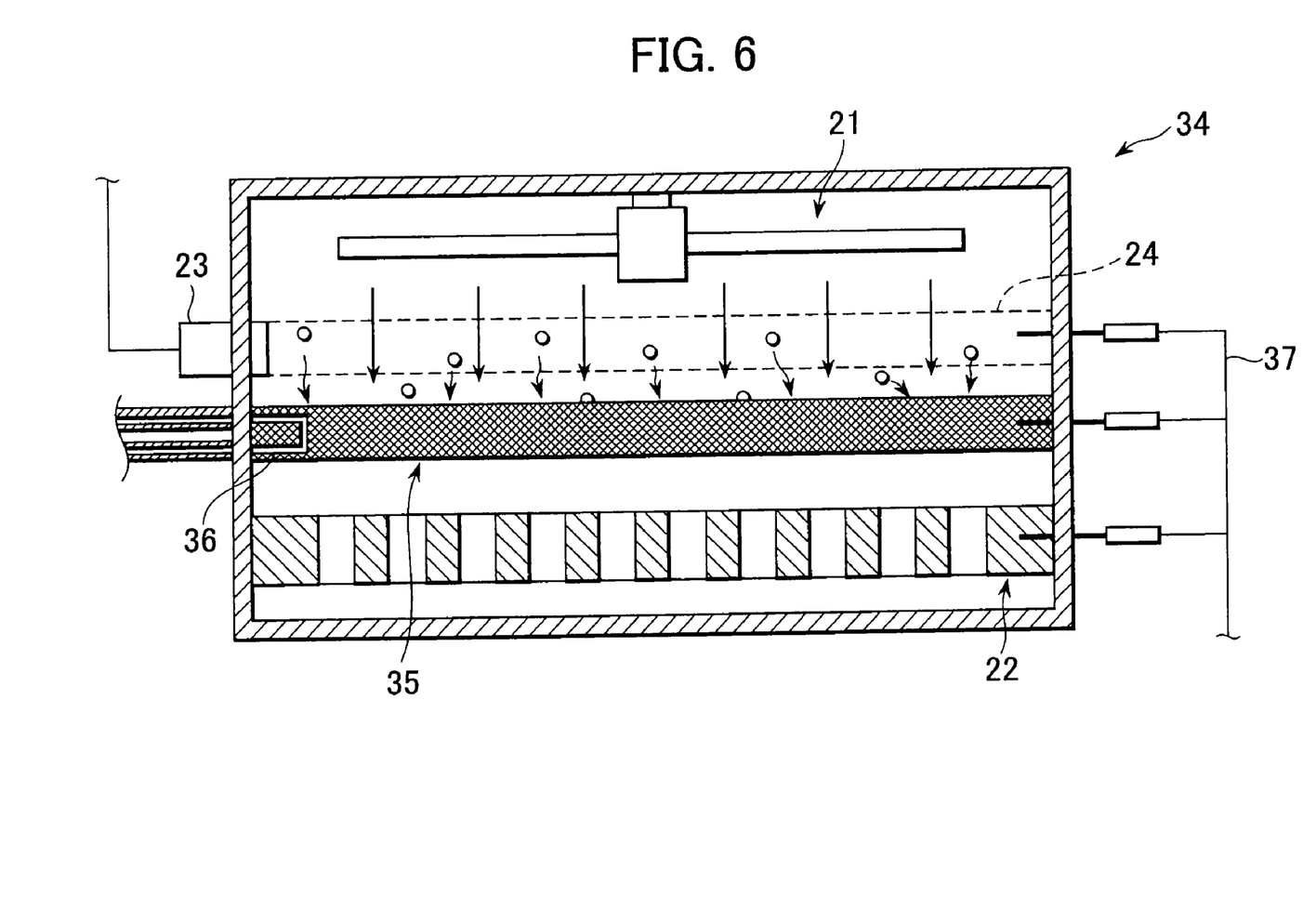
FIG. 6 is a section view schematically showing the construction of a fan filter unit including a filter of mesh structure and a chemical filter.

FIG. 6 schematically shows in cross section the construction of a fan filter unit 34 including a filter of mesh structure and a chemical filter. The fan filter unit 34 of FIG. 6 is basically the same in construction and function as the above described fan filter unit 20. In the following, only different constructions and functions will be explained, with explanations of common constructions and functions omitted.

As shown in FIG. 6, the fan filter unit 34 not only includes the filter 22 of mesh structure (mesh-like filter) but also includes a chemical filter 35 disposed between the high temperature part 24 and the filter 22. The chemical filter 35 contains activated carbon or the like, and is able to trap and remove gas molecules and organic molecules, which are the cause of generation of particles, or which are not the cause of generation of particles but are the cause of various problems.

The chemical filter 35 includes a cooling channel 36 formed therein for cooling the chemical filter 35. Thus, the chemical filter 35 can be brought to a temperature lower than that of the high temperature part 24, whereby a temperature gradient can be produced between the chemical filter 35 and the high temperature part 24. In the fan filter unit 34, though the filter 22 does not include a cooling channel, the filter 22 is brought to a temperature lower than that of the high temperature part 24. Therefore, a temperature gradient can be produced also between the filter 22 and the high temperature part 24.

With the above described fan filter unit 34, the filter 22 and/or the chemical filter 35 is able to trap particles being moved by a heating migrating force due to the temperature gradient between the filter 22 and the high temperature part 24 and/or between the chemical filter 35 and the high temperature part 24. Furthermore, gas molecules and organic molecules not trapped by the filter 22 can be trapped by the chemical filter 35. Thus, the particles can be removed more reliably. Since relatively large particles are trapped by the filter 22 and relatively small gas molecules and organic molecules are trapped by the chemical filter 35, the filter 22 and the chemical filter 35 are made less clogged, whereby the service life of the fan filter unit 34 can be made long.

The fan filter unit 34 may include a temperature sensor 37 for measuring temperatures of the filter 22, the chemical filter 35, and the high temperature part 24, whereby the same effects as those attained in the above described arrangement having such a temperature sensor can be attained.

Next, a description will be given of a gas purification apparatus and method according to a second embodiment of this invention.

The second embodiment is basically the same in construction and function as the first embodiment, but is only different therefrom in that not only a heat migrating force but also an electrostatic force is utilized for removal of particles. In the following, only different constructions and functions will be explained, with explanations of common constructions and functions omitted.

Figure 7:
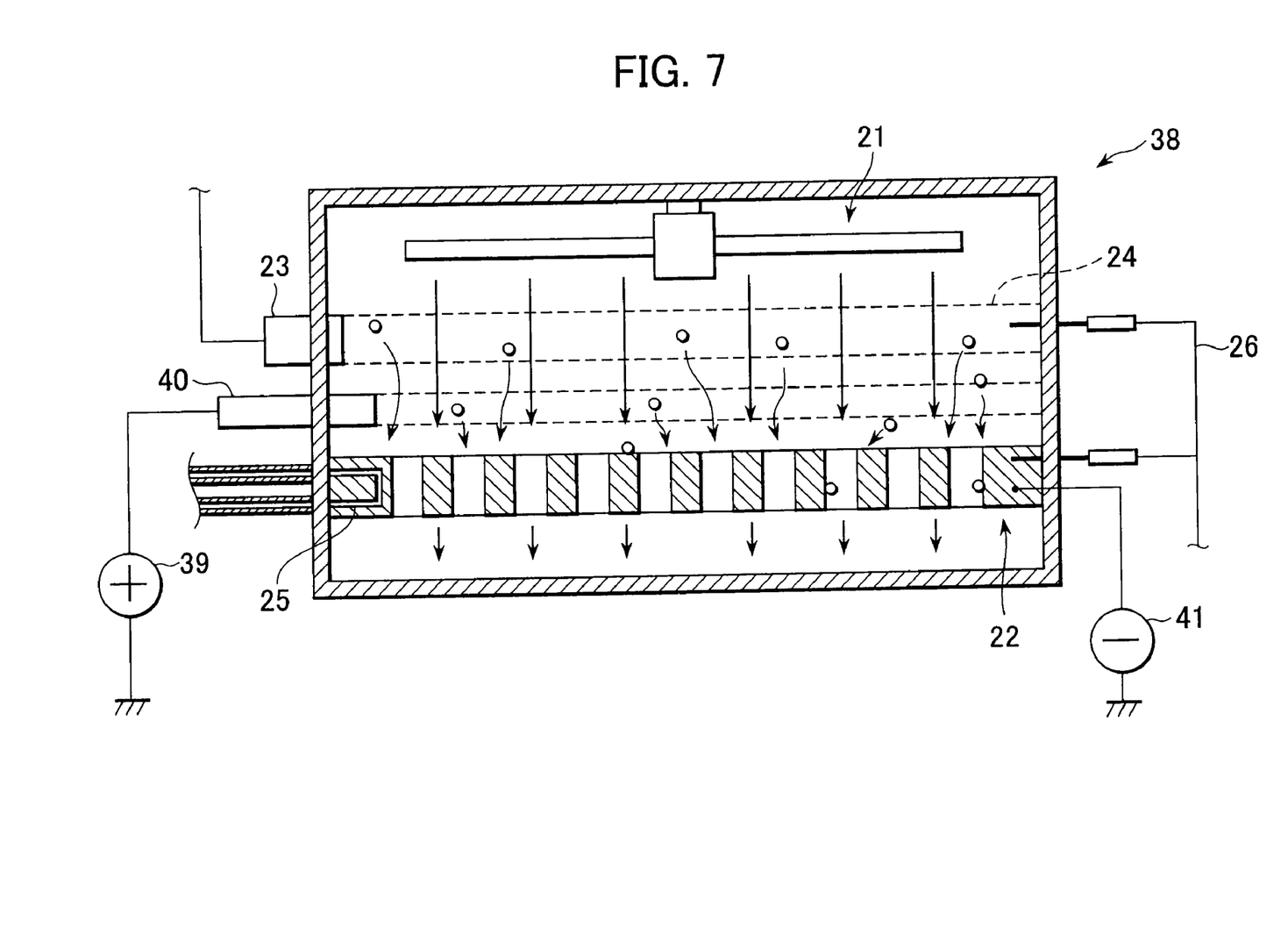
FIG. 7 is a section view schematically showing the construction of a fan filter as a gas purification apparatus according to a second embodiment of this invention.

FIG. 7 schematically shows in cross section a fan filter unit 38 as a gas purification apparatus of this embodiment.

As shown in FIG. 7, the fan filter unit 38 includes an ionizer 40 (fine particle charging unit) disposed between an irradiation heater 23 and a filter 22 and connected to a positive power supply 39, and a negative power supply 41 (filter potential generation unit) connected to the filter 22.

The ionizer 40 emits positive electric charges toward the atmospheric air flow, thereby charging particles mixed in the atmospheric air flow to positive polarity. In other words, the ionizer 40 for forcibly producing positive potential on the particles (particle potential generating step). Furthermore, negative potential is produced on the filter 22 by the negative power supply 41 (filter potential generating step). In the fan filter unit 38, electric potentials of opposite polarities to each other are produced on the filter 22 and the particles mixed in the atmospheric air flow. At that time, not only the above described heat migrating force but also an electrostatic force due to a potential difference between the particles and the filter 22 act on the particles, and therefore, the particles are moved toward the filter 22 also by means of the electrostatic force.

As in the case of heat migrating force, the magnitude of electrostatic force varies in dependence on the size of particles. A large electrostatic force acts on a large particle, but a large gravity force also acts on such a large particle, and therefore, a transfer force toward the filter 22 acting on a large particle is not very large. On the other hand, only a small gravity force acts on a small particle on which a small electrostatic force acts, and therefore, a transfer force acting toward the filter 22 on a small particle is not very small. In other words, substantially the same transfer forces toward the filter 22 due to electrostatic force act on both the large and small particles. As a result, in the fan filter unit 38, substantially the same transfer forces to move particles toward the filter 22 act on all the particles mixed in the atmospheric air flow.

In the fan filter unit 38 of this embodiment, since electric potential of polarity opposite from that of particles is produced on the filter 22, the particles are moved toward the filter 22 also by means of the electrostatic force. At that time, substantially the same transfer forces act on all the particles to move them toward the filter 22, whereby the particles can reliably be removed irrespective of particle size, without causing a reduction in the efficiency of atmospheric air supply.

Since the fan filter unit 38 includes the ionizer 40 for forcibly generating a positive potential (which is opposite in polarity from the filter) on particles, it is ensured that the potential on particles has a polarity opposite from that of the filter 22, whereby the electrostatic force toward the filter 22 reliably acts on the particles.

The above described fan filter unit 38 uses the ionizer 40 as an apparatus for charging particles. Instead, an excimer laser oscillator, an ultraviolet lamp, or a soft X-ray radiation unit may be used. Also in that case, particles can be charged reliably.

In the fan filter unit 38, electric potential having a desired polarity is forcibly generated on the particles by using the ionizer 40. However, the fan filter unit may not include the ionizer 40 or other apparatus for forcibly generating potential on the particles. In that case, the polarity of electric potential on the particles mixed in the atmospheric air flow may be measured (particle potential measuring step), and with reference to the result of electric potential measurement, electric potential having polarity opposite from that of particles may be generated on the filter 22, whereby an electrostatic force toward filter 22 can reliably be applied to the particles. For the measurement of polarity of electric potential on the particles, a particle potential measurement device 42 shown in FIG. 8 is used.

Figure 8:
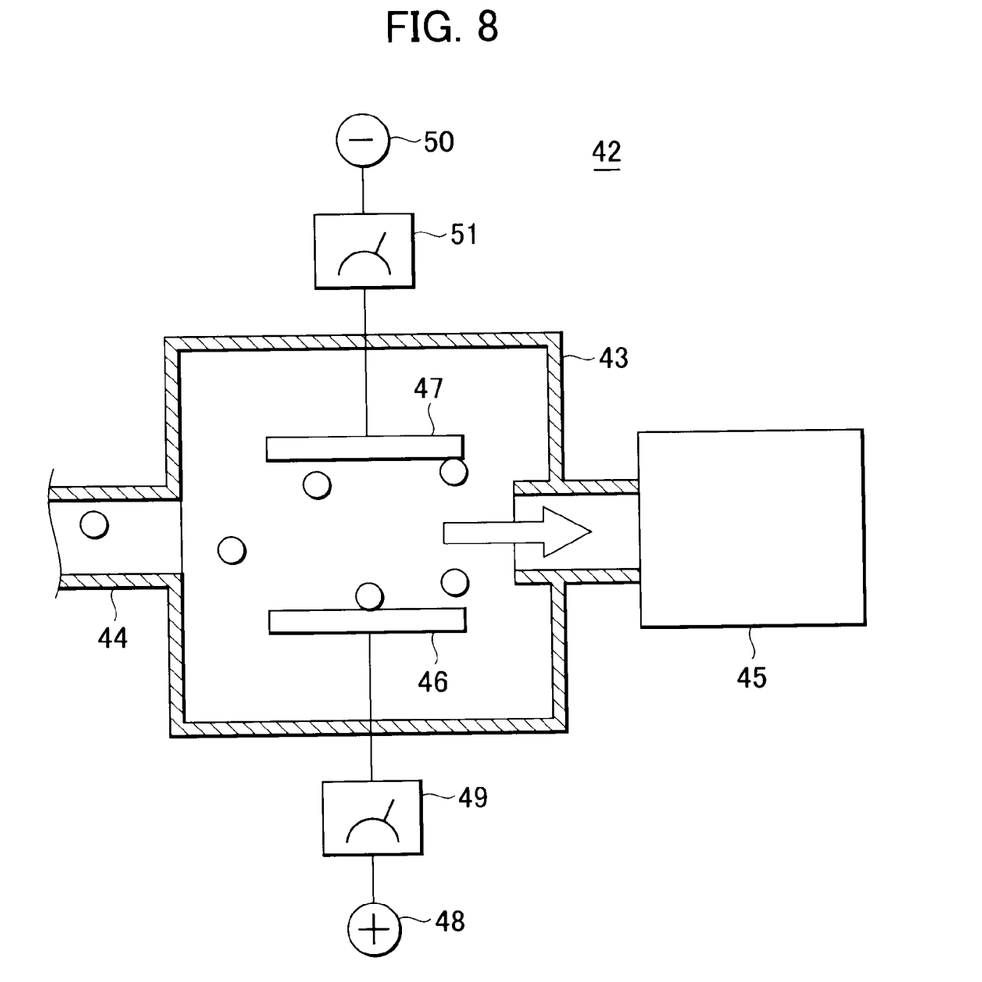
FIG. 8 is a section view schematically showing the construction of a particle potential measurement device.

FIG. 8 schematically shows in cross section the construction of the particle potential measurement device 42.

As shown in FIG. 8, the particle potential measurement device 42 includes a box-like chamber 43, a communication pipe 44 through which the chamber 43 is communicated with a fan filter unit (not shown), a suction pump 45 (fine particle introduction unit) disposed to face the communication pipe 44 via the chamber 43, and positive and negative electrodes 46, 47 (first and second electrodes) disposed inside the chamber 43 to face each other. In the particle potential measurement device 42, the communication pipe 44, the positive and negative electrodes 46, 47, and the suction pump 45 are disposed on a straight line.

A positive power supply 48 (first power supply) is connected to the positive electrode 46, and an ammeter 49 (first current measurement device) is connected between the positive electrode 46 and the positive power supply 48. A negative power supply 50 (second power supply) is connected to the negative electrode 47, and an ammeter 51 (second current measurement device) is connected between the negative electrode 47 and the negative power supply 50.

The suction pump 45 sucks the inside of the chamber 43, whereby atmospheric air containing particles and present inside the fan filter unit is introduced into the chamber 43 via the communication pipe 44. The atmospheric air introduced into the chamber 43 flows in the direction shown by an arrow in FIG. 8. Therefore, particles are introduced between the positive electrode 46 and the negative electrode 47. At that time, if electric potential is generated on the particles, the particles are trapped by the positive electrode 46 or the negative electrode 47 according to the electric potential. Specifically, particles on which positive potential is generated are trapped by the negative electrode 47, and particles on which negative potential is generated are trapped by the positive electrode 46. Then, electric charges on the trapped particles move toward the positive power supply 48 or the negative power supply 50, thus producing an electric current. Accordingly, by measuring the electric current by the ammeters 49, 51, the polarity of electric potential on the particles can reliably be measured.

In the case of the particle potential measurement device 42 being used, if the electric current measured by the ammeter 49 indicates that negative potential is generated on the particles, positive potential may be generated on the filter 22. On the other hand, when the electric current measured by the ammeter 51 indicates that positive potential is generated on the particles, negative potential may be generated on the filter 22.

The fan filter unit 38 is adapted to uniformly generate negative potential on the filter 22. However, in the case of a fan filter unit not having an apparatus for forcibly generating electric potential on the particles, electric potential on the particles mixed in atmospheric air flow are not uniform. Specifically, there are particles on which positive potential is generated and other particles on which negative potential is generated. In such a case, positive potential and negative potential may be generated simultaneously on the filter 22. Preferably, positive potential and negative potential should alternately be generated in a direction perpendicular to the atmospheric air flow. In that case, electrostatic force acting toward the filter 22 can be applied to the particles irrespective of electric potential on the particles, whereby the particles can reliably be trapped by the filter 22 before passing therethrough.

In the above described second embodiment, heat migrating force is used by the filter 22 to trap the particles. However, only electrostatic force may be used to trap the particles.

Figure 9:
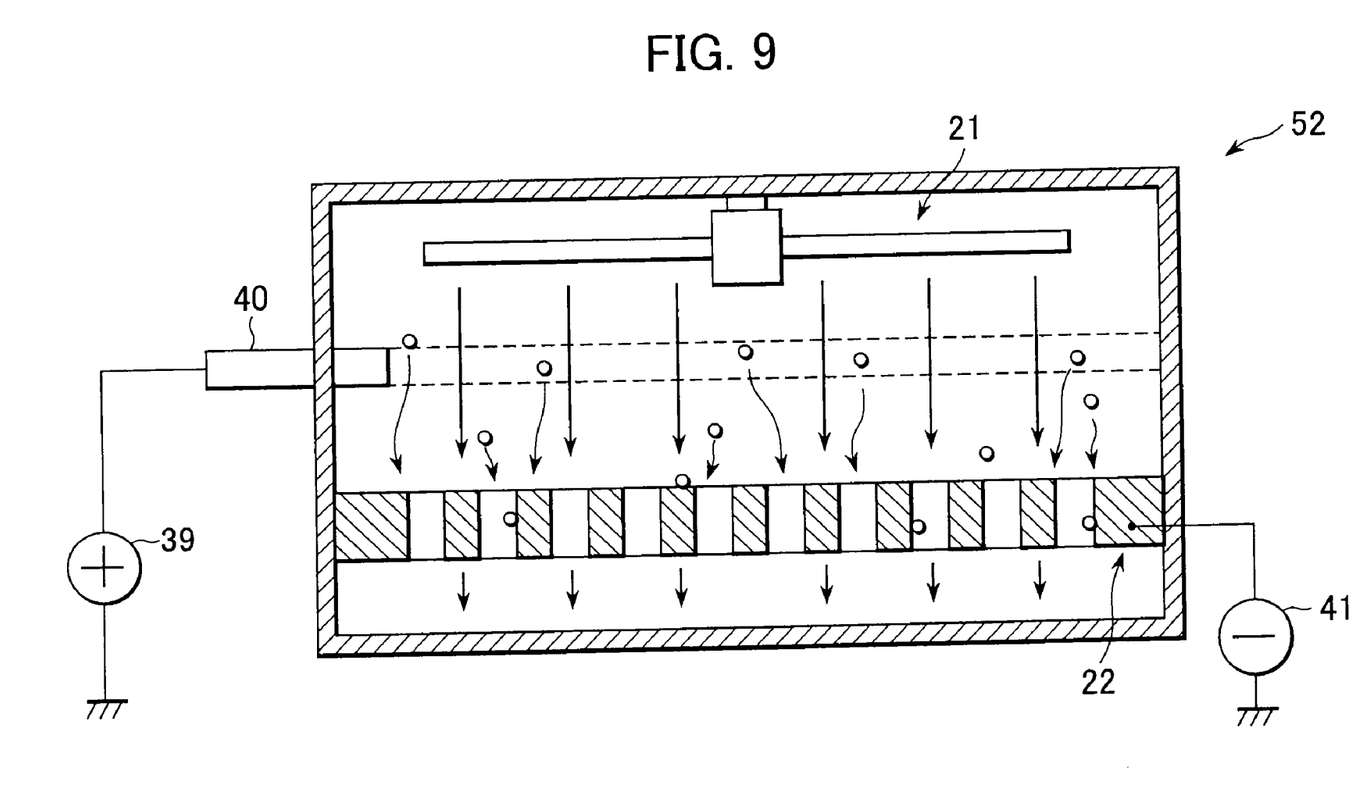
FIG. 9 is a section view schematically showing the construction of a fan filter unit in which only electrostatic force is used.

FIG. 9 schematically shows in cross section the construction of a fan filter unit 52 in which only electrostatic force is utilized.

As shown in FIG. 9, the fan filter unit 52 includes a fan 21, a filter 22 to which a negative power supply 41 is connected, and an ionizer 40 disposed between the fan 21 and the filter 22 and connected to a positive power supply 39. In the fan filter unit 52, positive potential is forcibly produced on particles contained in an atmospheric air flow generated by the fan 21, and a negative potential is produced on the filter 22. As a result, an electrostatic force is applied to the particles that are thereby moved toward the filter 22.

In the above described first and second embodiments, particles are trapped by one or more filters. However, with elapse of time, an amount of particles trapped by each filter increases, causing a fear that there occurs a reduction in the conductance of the filter. In this regard, the fan filter unit should preferably include a heater (heating unit) for heating the one or more filters. When each filter is heated by the heater, particles trapped by the filter are discharged therefrom by means of thermal stress, making it easy to perform cleaning of the filter and make the service life of the fan filter unit to be long.

In the above described first and second embodiments, a cooling channel is used to cool the filter. However, instead of the cooling channel, a peltiert device or a heat pump may be used.

What is claimed is:

1. A gas purification apparatus comprising:
a fan adapted to generate a gas flow;
at least one filter adapted to be disposed downstream of said fan and trap and remove fine particles mixed in the gas flow; and
at least one high temperature part disposed in the gas flow and higher in temperature than said filter,
wherein said filter includes a temperature difference maintaining device adapted to maintain a temperature difference between said at least one high temperature part and said filter by cooling said filter, and
wherein said at least one high temperature part includes a irradiation heater disposed both upstream and downstream of said filter in the gas flow such that said at least one high temperature part and said filter are spaced from each other and no other member is interposed therebetween.

2. A gas purification apparatus according to claim 1, wherein said temperature difference maintaining device is adapted to maintain the temperature difference between said high temperature part and said filter at a value equal to or larger than 3 degrees Celsius.

3. A gas purification apparatus according to claim 1, wherein said at least one high temperature part includes at least one high temperature part disposed upstream of said filter in the gas flow and at least one high temperature part disposed downstream of said filter in the gas flow.

4. A gas purification apparatus according to claim 1, wherein said at least one filter is made of a high thermal conductivity material.

5. A gas purification apparatus according to claim 1, including a heating unit adapted to heat said filter.

6. A gas purification method for a gas purification apparatus including a fan for generating a gas flow and at least one filter disposed downstream of said fan for trapping and removing fine particles mixed in the gas flow and having a temperature difference maintain device, the gas purification method comprising:
generating at least one high temperature part in the gas flow, the at least one high temperature part being higher in temperature than the filter by irradiation heaters,
wherein the filter maintains a temperature difference between the at least one high temperature part and the filter by cooling the filter using the temperature difference maintaining device, and
wherein said generating includes generating the at least one high temperature part both upstream and downstream of the filter in the gas flow such that the at least one high temperature part and the filter are spaced from each other and no other member is interposed therebetween.

7. A gas purification method according to claim 6, wherein the filter is cooled in said high temperature part generation step.

* * * * *